US008830758B2

(12) United States Patent
Imai et al.

(10) Patent No.: US 8,830,758 B2
(45) Date of Patent: Sep. 9, 2014

(54) SEMICONDUCTOR STORAGE DEVICE

(75) Inventors: Seiro Imai, Tokyo (JP); Kazuhiko Miki, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 297 days.

(21) Appl. No.: 13/235,643

(22) Filed: Sep. 19, 2011

(65) Prior Publication Data

US 2012/0230131 A1    Sep. 13, 2012

(30) Foreign Application Priority Data

Mar. 7, 2011   (JP) ................................. 2011-049550

(51) Int. Cl.
| | | |
|---|---|---|
| G11C 7/06 | (2006.01) | |
| G11C 7/08 | (2006.01) | |
| G11C 7/14 | (2006.01) | |
| G11C 7/22 | (2006.01) | |
| G11C 16/26 | (2006.01) | |
| G11C 16/28 | (2006.01) | |

(52) U.S. Cl.
CPC ...................................... G11C 7/065 (2013.01)
USPC .................... 365/185.21; 365/185.2; 365/205; 365/207; 365/210.1; 365/189.07

(58) Field of Classification Search
CPC .......... G11C 7/06; G11C 7/062; G11C 7/065; G11C 7/08; G11C 7/1006; G11C 7/1051; G11C 7/14; G11C 7/22
USPC .................. 365/189.07, 196, 205, 207, 210.1
See application file for complete search history.

(56) References Cited

U.S. PATENT DOCUMENTS

| | | | |
|---|---|---|---|
| 6,865,127 | B2 | 3/2005 | Hasegawa et al. |
| 7,023,749 | B2 | 4/2006 | Hasegawa et al. |
| 2007/0147112 | A1* | 6/2007 | Edahiro et al. ............. 365/185.2 |
| 2010/0002528 | A1 | 1/2010 | Okawa |
| 2010/0090725 | A1 | 4/2010 | Imai et al. |
| 2010/0195422 | A1 | 8/2010 | Imai |
| 2011/0050330 | A1 | 3/2011 | Miki et al. |

FOREIGN PATENT DOCUMENTS

| | | |
|---|---|---|
| JP | 06-076587 A | 3/1994 |
| JP | 09-320276 A | 12/1997 |
| JP | 11-016371 A | 1/1999 |
| JP | 2003-317479 | 11/2003 |

(Continued)

OTHER PUBLICATIONS

JP Office Action mailed on Jun. 25, 2013 in corresponding JP Application No. 2011-049550 along with English translation.

*Primary Examiner* — J. H. Hur
(74) *Attorney, Agent, or Firm* — White & Case LLP (57) ABSTRACT

According to one embodiment, a semiconductor storage device includes cells, and a sense amplifier. Each of the cells is connected to a bit line. The sense amplifier reads out data. The sense amplifier includes a first transistor to third transistor, and a switch. The first transistor has one end of a current path, the other end, and a gate. The second transistor has one end, and the other end. The second transistor has one of a first and a second supply ability. The third transistor has one end, and the other end. The third transistor has one of a third and a fourth supply ability. The switch grounds the second and the third transistors. The sense amplifier turns off the first transistor after transferring the data to an outside, and supplies the second signal to the switch to set gates of the second transistor and third transistor to ground.

11 Claims, 7 Drawing Sheets

(56) References Cited

FOREIGN PATENT DOCUMENTS

| | | |
|---|---|---|
| JP | 2005-285161 A | 10/2005 |
| JP | 2006-351176 A | 12/2006 |
| JP | 2007-172775 A | 7/2007 |
| JP | 2007-193854 A | 8/2007 |
| JP | 2008-047205 A | 2/2008 |
| JP | 2010-015614 | 1/2010 |
| JP | 2010-182346 A | 8/2010 |
| JP | 2010-263955 A | 11/2010 |

* cited by examiner

SEMICONDUCTOR STORAGE DEVICE

CROSS-REFERENCE TO RELATED APPLICATIONS

This application is based upon and claims the benefit of priority from prior Japanese Patent Application No. 2011-049550, filed Mar. 7, 2011, the entire contents of which are incorporated herein by reference.

FIELD

Embodiments described herein relate generally to, a semiconductor storage device which prevents a deterioration in characteristics by, for example, preventing long-time voltage application to the gate of a MOS transistor in a sense amplifier.

BACKGROUND

Demands have arisen for a flash memory with a long service life and long-term operational stability. A sense amplifier which detects data held by a memory cell transistor compares a current flowing in a bit line with a current flowing in a reference signal line and determines, based on the potential determined by the comparison result, whether the data held by the memory cell transistor is binary 1 or binary 0.

If, however, a voltage is applied for a long time to the gate of a MOS transistor forming a sense amplifier, which makes a current flow corresponding to the magnitude of a current flowing in the bit line or the reference signal line, the transistor characteristics deteriorate, resulting in a failure to read accurate data.

DETAILED DESCRIPTION

The embodiments will be described below with reference to the accompanying drawings. The same reference numerals denote the same parts throughout the views of the accompanying drawing.

First Embodiment

In general, according to one embodiment, a semiconductor storage device includes a plurality of memory cells, and a sense amplifier. A plurality of memory cells is formed for each column and each row. Each of the plurality of memory cells is connected to a bit line at one end of a current path. The sense amplifier reads out data held by the memory cell by comparing a first current flowing in the bit line in accordance with the data with a second current flowing in a reference signal line which is set as a comparison current for the first current. The sense amplifier includes a first MOS transistor, a second MOS transistor, a third MOS transistor, a switch unit. The first MOS transistor has one end of a current path to which a first voltage is applied, has the other end connected to a first node, and has a gate to which a first signal is supplied. The second MOS transistor has one end of a current path connected to the first node, and has the other end connected to a second node to which a reference signal line is connected. The second MOS transistor has one of a first supply ability and a second supply ability higher than the first supply ability in accordance with the data held by the memory cell. The third MOS transistor has one end of a current path connected to the first node, has the other end connected to a third node connected to the bit line. The third MOS transistor has one of a third supply ability and a fourth supply ability higher than the third supply ability in accordance with a current flowing in the reference signal line. The switch unit grounds each of the second MOS transistor and the third MOS transistor when a second signal is supplied. The sense amplifier turns off the first MOS transistor after transferring the data read out from the memory cell to an outside, and then supplies the second signal to the switch unit to set gates of the second MOS transistor and third MOS transistor to ground potential.

A semiconductor storage device according to the first embodiment will be described with reference to FIG. 1. The semiconductor storage device according to the first embodiment generates a plurality of signals based on signal clocks CLK supplied from an external host device, and senses and latches data by adjusting (delaying) the timings of the generated signals. This device is configured to keep the applied voltage to the gate of a MOS transistor forming a sense amplifier at 0 V in the interval from the end of this data sensing operation to the beginning of the next precharge operation, thereby avoiding load on the MOS transistor.

<Overall Arrangement>

Figure 1:
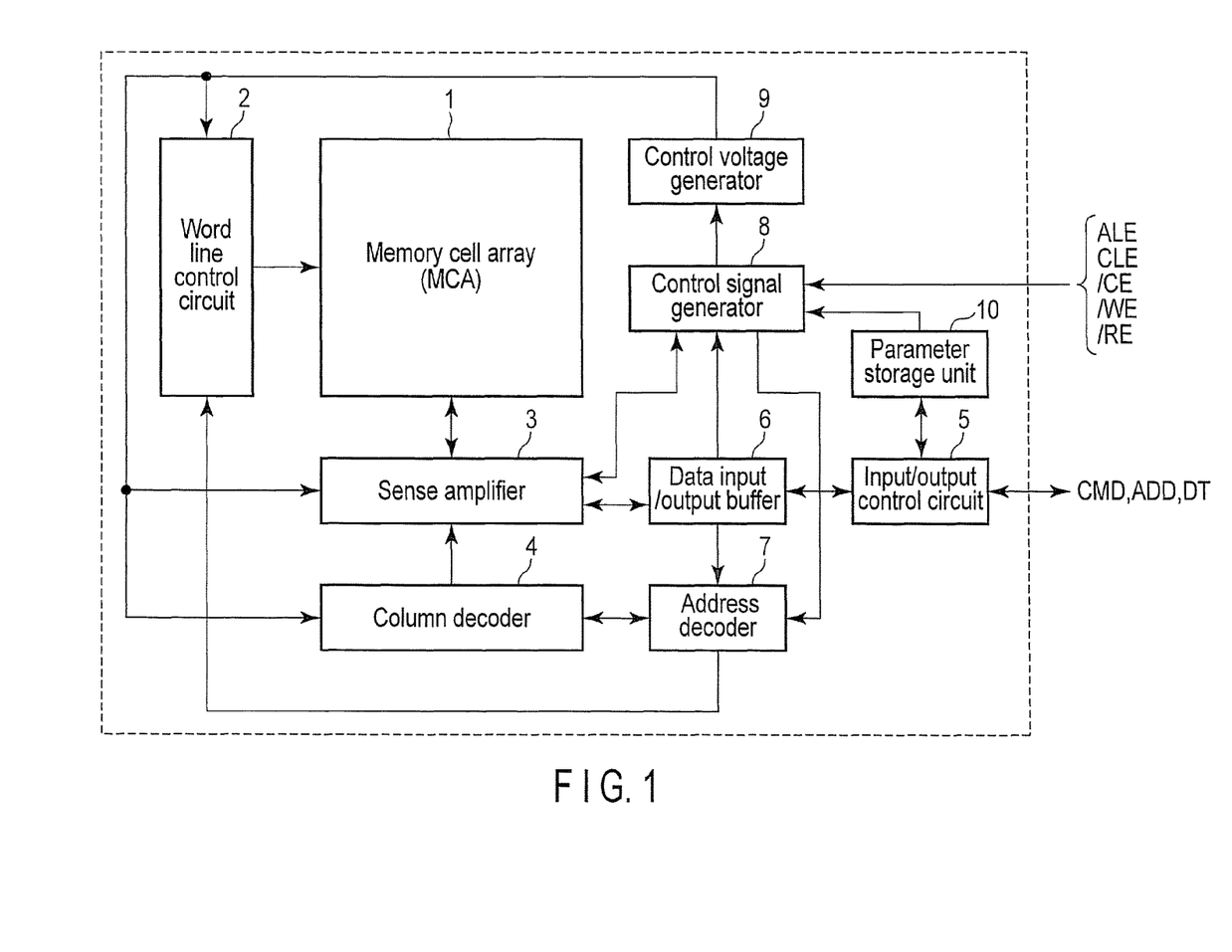
FIG. 1 is a block diagram showing the schematic arrangement of a flash memory according to the first embodiment.

FIG. 1 is a block diagram showing the schematic arrangement of a flash memory according to this embodiment. As shown in FIG. 1, the flash memory according to this embodiment includes a memory cell array 1 ("MCA" in FIG. 1), a word line control circuit 2, a sense amplifier 3, a column decoder 4, an input/output control circuit 5, a data input/ output buffer 6, an address decoder 7, a control signal generator 8, a control voltage generator 9, and a parameter storage unit 10.

The memory cell array 1 is a semiconductor memory including a nonvolatile memory cell transistor MT which can hold data of, for example, two or more levels. The control gate of the memory cell transistor MT is connected to a word line WL. One end of the current path of the memory cell transistor MT is connected to a bit line BL, and the other end is connected a source line SL. The arrangement of the memory cell array 1 will be described in detail later with reference to FIG. 2.

The word line control circuit 2 functions as a row decoder. That is, the word line control circuit 2 selects the row direction of the memory cell array 1, and transfers a necessary voltage generated by the control voltage generator 9 to the selected memory cell transistor MT.

The sense amplifier 3 is connected to the bit line BL of the memory cell array 1. The sense amplifier 3 has a function of reading and writing data to and from the memory cell transistor MT. The sense amplifier 3 transfers the write data supplied from the data input/output buffer 6 to the memory cell transistor MT.

The column decoder 4 outputs a column select signal for selecting a bit line of the memory cell array 1 in accordance with an output signal from the address decoder 7. That is, when writing data in the memory cell transistor MT, the column decoder 4 selects the corresponding bit line BL in accordance with an output signal from the address decoder 7.

The input/output control circuit 5 receives various kinds of commands CMD, an address signal ADD, write data DT, and read data supplied from a host device (not shown). For example, at the time of data write, the input/output control circuit 5 supplies write data to the sense amplifier 3 via the data input/output buffer 6. The input/output control circuit 5 supplies an address signal to the address decoder 7 via the data input/output buffer 6. In addition, the input/output control circuit 5 supplies a command to the control signal generator 8 via the data input/output buffer 6. At the time of data read, the input/output control circuit 5 causes the sense amplifier 3 to read data, and then temporarily holds the data transferred to the data input/output buffer 6. Thereafter, the input/output control circuit 5 outputs the read data to a host device (not shown).

The data input/output buffer 6 receives data LSAOUT supplied from the sense amplifier 3 and outputs it as data Dout to the input/output control circuit 5. The data input/output buffer 6 receives write data and an address signal from the input/output control circuit 5, and supplies the write data to the sense amplifier 3 and the address signal to the address decoder 7.

The address decoder 7 receives an address signal from the data input/output buffer 6. The address decoder 7 decodes the address signal and supplies the decoding result to the word line control circuit 2 and the column decoder 4.

The control signal generator 8 receives, from a host (not shown), external control signals such as a chip enable signal /CE, a write enable signal /WE, a read enable signal /RE, an address latch enable signal ALE, and a command latch enable signal CLE.

The control signal generator 8 generates control signals for controlling data write and erase sequences and a control signal (to be described later) for controlling data read based on external control signals and commands supplied in accordance with operation modes. These control signals are generated based on signal clocks CLK supplied from the external host device. The control signal generator 8 supplies these control signals to the sense amplifier 3, the control voltage generator 9, and the address decoder 7. The detailed arrangement of the control signal generator 8 will be described later.

The control voltage generator 9 generates voltages necessary for various kinds of operations of the memory cell array 1, sense amplifier 3, and column decoder 4, such as a read voltage, a write voltage, a verify voltage, and an erase voltage, in accordance with various control signals supplied from the control signal generator 8.

The parameter storage unit 10 is connected to the input/output control circuit 5 and the control signal generator 8, and stores parameters suitable for the quality of a chip which are determined in a test step.

<Details of Memory Cell Array 1 and Sense Amplifier 3>

Figure 2:
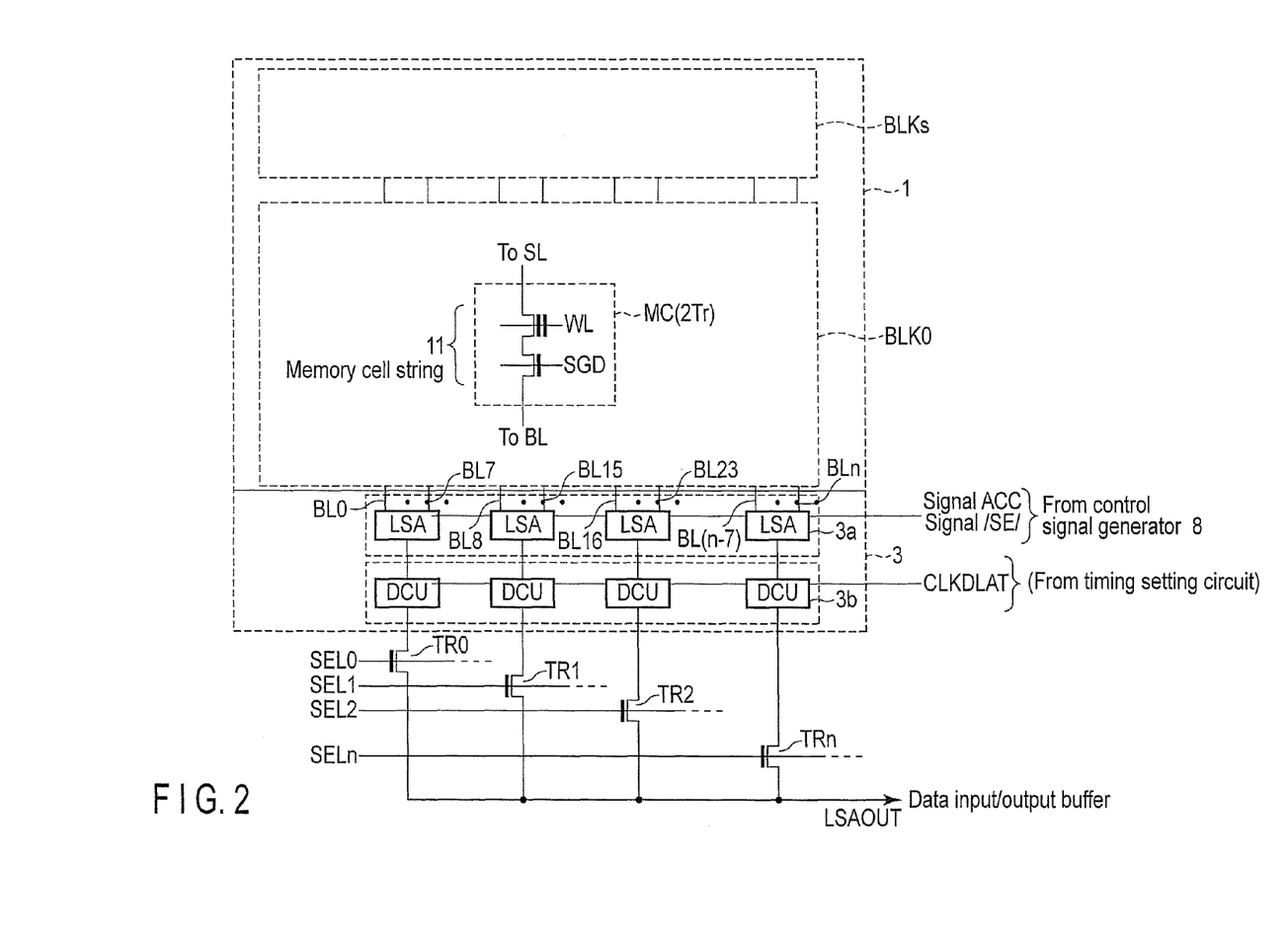
FIG. 2 is a circuit diagram showing the arrangements of a memory cell transistor and sense amplifier according to the first embodiment.

The detailed arrangements of the memory cell array 1 and sense amplifier 3 will be described next with reference to FIG. 2. FIG. 2 is a block diagram showing the memory cell array 1 and the sense amplifier 3.

As shown in FIG. 2, each of blocks BLK0 to BLKs includes a plurality of memory cells MC, i.e., memory cells 2Tr (FIG. 2 shows only one memory cell), each constituted by a pair of the nonvolatile memory cell transistor MT and a select transistor ST series-connected to the memory cell transistor MT. The memory cells MC are arranged in a matrix form in the row and column directions. The memory cell transistor MT and the select transistor ST can together hold, for example, 1-bit data. This memory cell MC will be sometimes referred to as a memory cell string 11.

The memory cell transistor MT of the memory cell MC has a MONOS structure including a charge storage layer (for example, an insulating film) formed on a gate insulating film on a semiconductor substrate, an insulating film (to be referred to as a block layer) having a higher dielectric constant than the charge storage layer, and a control gate electrode formed on the block layer. The memory cell transistor MT may be of an FG type. Note that the number of memory cells MC included in each of the blocks BLK0 to BLKs may not be limited to, for example, 32, but may be 64, 128, or 256. That is, the number of memory cells is not limited to any specific number. The drain region of the memory cell transistor MT which is located on the one end side of the current path is connected to the source region of the select transistor ST, and the source region on the other end side is commonly connected to the source line SL.

The control gate electrodes of the memory cell transistors MT in the same row are commonly connected to one of the plurality of word lines WL, and the gate electrodes of the select transistors ST of the memory cell transistors MT in the same row are commonly connected via a select gate line SGD. Note that the number of word lines WL depends on the number of memory cells MC formed along the row direction, and may be 16, 32, or more. In the memory cell array 1, the drains of the select transistors ST in the same column are commonly connected to one of bit lines BL0 to BLn. Bit lines BL0 to BLn will be collectively referred to as the bit lines BL (n: natural number) when they are not distinguished from each other.

Data are collectively written in the plurality of memory cell transistors MT connected to the same word line WL, and this unit is called a page.

The sense amplifier 3 will be described next. The sense amplifier 3 includes a plurality of LSA (Local Sense-Amp) cores ("LSA" in FIG. 2) 3a and data controllers ("DCU" in FIG. 2) 3b equal in number to the LSA cores 3a. For example, the data LSAOUT read out from the memory cell transistors MT are transferred to the data input/output buffer 6 via the LSA cores 3a and the data controllers 3b.

At the time of data read, each LSA core 3*a* detects the data read out from the memory cell transistor MT to the bit line BL and temporarily holds the data. The LSA core 3*a* then transfers the data to the data input/output buffer 6 via the data controller 3*b*. More specifically, the LSA core 3*a* determines, based on the value of the voltage (current) of the bit line BL precharged (to be described later) first and then sensed, whether the corresponding data is binary 0 or binary 1, and transfers the data to the data input/output buffer 6 via the data controller 3*b*. In addition, the LSA core 3*a* temporarily holds the data supplied from the data controller 3*b*, and transfers a voltage corresponding to the data to the bit line BL.

The LSA cores 3*a* are respectively connected to bit lines BL0 to BL7, bit lines BL8 to BL15, . . . , bit lines BL(n–7) to BLn. That is, a given one of the LSA cores 3*a* allows selection of bit lines BL0 to BL7. Another given one of the LSA cores 3*a* allows selection of bit lines BL8 to BL15. This applies to the LSA core 3*a* corresponding to bit lines BL(n–7) to BLn. At the time of data read and data write, the LSA cores 3*a* select one bit line BL from, for example, bit lines BL(n–7) to BLn.

A read setting circuit 81 (to be described later) supplies signal CLKDLAT to the data controller 3*b*. When receiving signal CLKDLAT, the data controller 3*b* holds the newly read data transferred from the LSA core 3*a*. That is, the data controller 3*b* updates the held data. More specifically, when signal CLKDLAT is made low, the data controller 3*b* determines held data.

MOS transistors TR0 to TRn will be described next. One end of each of the current paths of MOS transistors TR0 to TRn is connected to the data controller 3*b*, and the other end of the current path is connected to the data input/output buffer 6. Note that MOS transistors TR0 to TRn will be simply referred to as MOS transistors TR when they are not distinguished from each other. Column select signals SEL0 to SELn are given to the gates of MOS transistors TR0 to TRn. Note also that the column select signals SEL0 to SELn will be simply referred to as column select signals SEL when they are not distinguished from each other.

At the time of data read, when the MOS transistor TR is turned on by the column select signal SEL, the data held by the data controller 3*b* is transferred to the data input/output buffer 6.

At the time of data write, when the MOS transistor TR is turned on by the column select signal SEL, the data controller 3*b* temporarily holds the write data supplied from the data input/output buffer 6, and then writes the data in the memory cell transistor MT via the LSA core 3*a*.

In the above write operation (to be sometimes called program operation) and read operation (including program verify operation [sometimes called a verify operation]), one of the plurality of bit lines BL connected to the LSA core 3*a* is selected, and one of the word lines WL0 to WL31 is selected. Applying a write or read voltage to all the memory cell transistors MT connected to the selected word line WL will simultaneously write or read data in or from the respective transistors.

As described above, referring to FIG. 2, for example, eight bit lines BL are connected to one LSA core 3*a*. In this case, it is necessary to provide a select circuit (not shown) which selects one bit line BL from the eight bit lines BL. That is, the LSA core 3*a* is electrically connected to the bit line BL selected by the select circuit (not shown) to write or read data. The number of bit lines BL to be connected to the LSA core 3*a* is not limited to that described above. For example, one LSA core 3*a* may be provided for the two bit lines BL. Furthermore, one LSA core 3*a* may be provided for one bit line BL.

In addition, the data controller 3*b* is connected to the LSA core 3*a*. However, this embodiment is not limited to this. For example, it is possible to provide one data controller 3*b* for the eight LSA cores 3*a* so as to selectively connect the data controller 3*b* to the LSA core 3*a*.

Note that the block BLK is the unit of erase operation. That is, data in the memory cells MC are erased for each block BLK.

Figure 3:
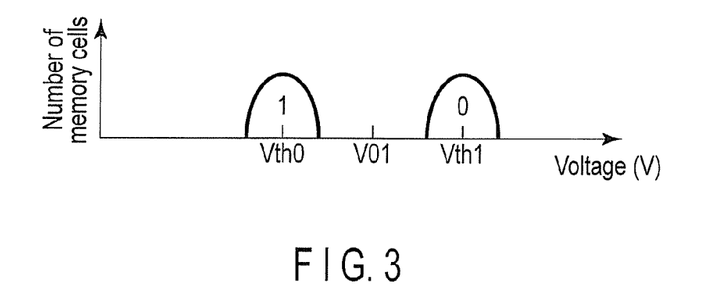
FIG. 3 is a graph showing the threshold distribution of memory cell transistors according to the first embodiment.

The threshold distribution of the memory cell transistors MT described above will be described next with reference to FIG. 3. FIG. 3 is a graph, with the abscissa representing the threshold distribution, and the ordinate representing the number of memory cell transistors MT.

As shown in FIG. 3, each memory cell transistor MT can hold, for example, binary (2-levels) data (1-bit data). That is, the memory cell transistor MT can hold two types of data, i.e., binary 1 and binary 0, in ascending order of a threshold voltage Vth.

A threshold voltage Vth0 for binary 1 in the memory cell transistor MT is given by Vth0<V01. A state in which binary 1 is held is defined as an erase state.

A threshold voltage Vth1 for binary 0 is given by V01<Vth1. A state in which binary 0 is held is defined as a program state. In this manner, the memory cell transistor MT can hold 1-bit data as binary 0 or binary 1 in accordance with a threshold. This threshold voltage varies when charge is injected into the charge storage layer. In addition, the memory cell transistor MT may be configured to hold data of four or more levels.

<Example of Detailed Arrangement of Control Signal Generation Circuit 8>

Figure 4:
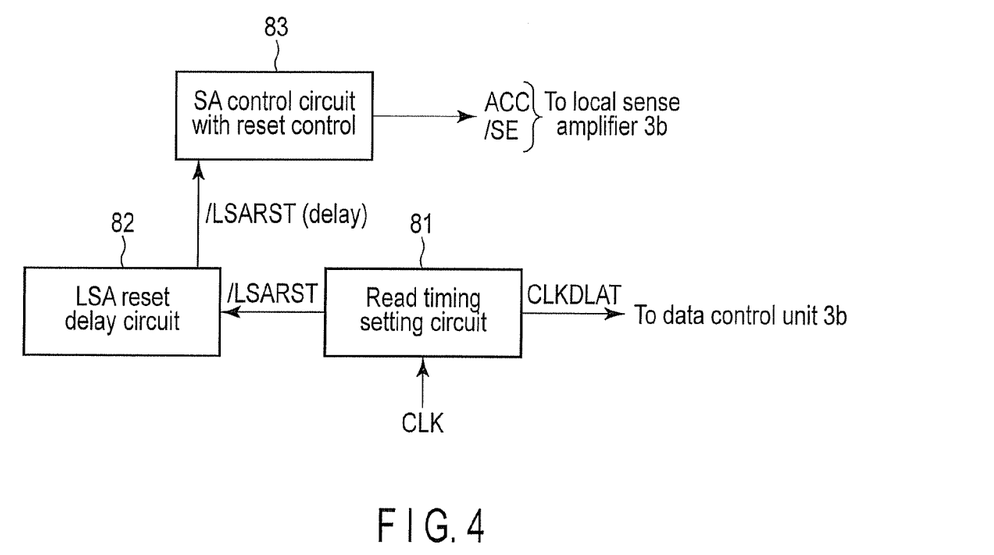
FIG. 4 is a block diagram showing the internal arrangement of a control signal generator according to the first embodiment.

An example of the arrangement of the control signal generator 8 will be described next with reference to FIG. 4. The control signal generator 8 generates a control signal (to be described below) based on the clock CLK transferred from an external host device (not shown). Clock CLK is made either low or high. The period from the instant clock CLK goes low to the instant the clock goes high is called one cycle, which is a reference for data read. That is, this clock signal controls the timing of the transfer of data read out from the memory cells MC to the outside.

The control signal generator 8 includes the read timing setting circuit 81, an LSA reset delay circuit 82, and an LSA control circuit 83. The read timing setting circuit 81 generates a signal /LSARST ("/" represents an inverted signal; ditto for the following other signals) and a signal CLKDLAT based on the clock CLK transferred from the host device. The read timing setting circuit 81 supplies the generated signal /LSARST to the LSA reset delay circuit 82, and also supplies the generated signal CLKDLAT to the data controller 3*b*. An example of the arrangement of the read timing setting circuit 81 will be described with reference to FIG. 5.

<Example of Arrangement of Read Timing Setting Circuit 81>

Figure 5:
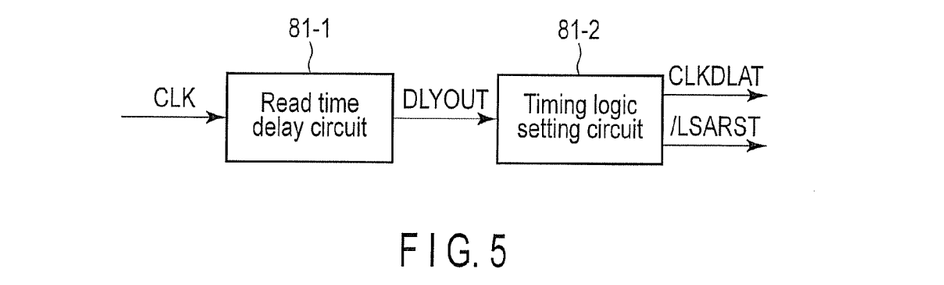
FIG. 5 is a block diagram showing the internal arrangement of the control signal generator according to the first embodiment.

As shown in FIG. 5, the read timing setting circuit 81 includes a read time delay circuit 81-1 and a timing logic setting circuit 81-2. The read time delay circuit 81-1 outputs a delay signal (to be referred to as a signal DLYOUT hereinafter) based on the clock CLK. The output signal DLYOUT is supplied to the timing logic setting circuit 81-2.

The timing logic setting circuit 81-2 outputs signal CLKDLAT and signal /LSARST based on signal DLYOUT. An example of the detailed arrangement of the timing logic setting circuit 81-2 will be described with reference to FIG. 6.

<Example of Arrangement of Timing Logic Setting Circuit 81-2>

Figure 6:
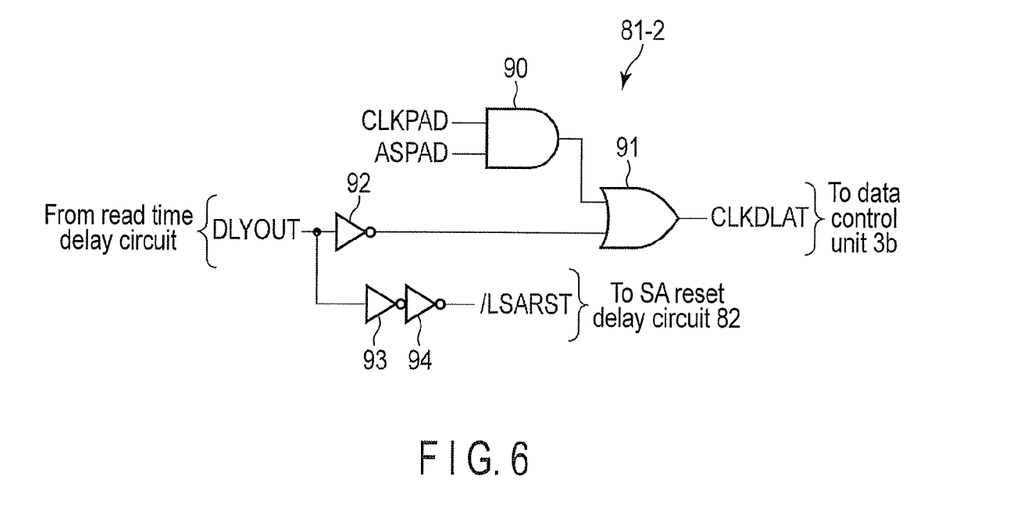
FIG. 6 is a circuit diagram showing the internal arrangement of the control signal generator according to the first embodiment.

As shown in FIG. 6, the timing logic setting circuit 81-2 includes an AND gate 90, an OR gate 91, and inverters 92 to 94.

The series-connected inverters 93 and 94 receive signal DLYOUT and supply it as signal /LSARST to the LSA reset delay circuit 82.

The inverter 92 receives signal DLYOUT and signal (signal /DLYOUT) obtained by inverting signal DLYOUT to terminal of the OR gate 91. The AND gate 90 performs logical operation of a signal CLKPAD and a signal ASPAD and supplies the result to the OR gate 91. In this case, signal CLKPAD is a signal for setting the timing when the input/output control circuit 5 latches the address transferred from a host (not shown). Signal ASPAD is a signal indicating whether to read out data from the memory cell transistor MT corresponding to the supplied address. That is, when reading the address supplied to the input/output control circuit 5 to read out data in accordance with an instruction from the host device, both signals CLKPAD and ASPAD are made high.

The OR gate 91 computes the OR between the signals respectively supplied from the AND gate 90 and the inverter 92, and supplies the computation result as signal CLKDLAT to the data controller 3b.

<LSA Reset Delay Circuit 82>

The LSA reset delay circuit 82 sets the timing between reset operation for the LSA core 3a and the operation of the data controller 3b which latches the data read out from the LSA core 3a. More specifically, the LSA reset delay circuit 82 delays signal /SE relative to signal /LSARST.

<Example of Arrangement of SA Control Circuit (LSA Control Circuit) 83>

Figure 7:
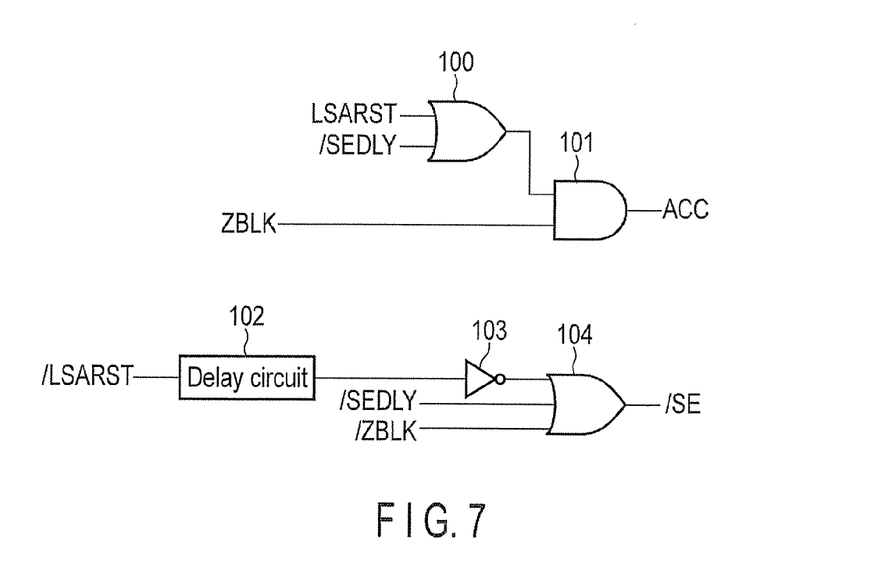
FIG. 7 is a circuit diagram showing the internal arrangement of the control signal generator according to the first embodiment.

An example of the arrangement of the LSA control circuit 83 will be described next with reference to FIG. 7. As shown in FIG. 7, the LSA control circuit 83 includes OR gates 100 and 104, an AND gate 101, a delay circuit 102, and an inverter 103. The OR gate 100 computes the OR between a signal LSARST and a signal /SEDLY (SEBDLY), and supplies the computation result to one terminal of the AND gate 101. When one of signals LSARST and /SEDLY is made high, the OR gate 100 supplies a high signal to the AND gate 101. Note that signal /SEDLY is a signal generated based on the address of the memory cell transistor MT to be read which is supplied from the external host device. The LSA core 3a amplifies the read data based on signal /SEDLY.

The AND gate 101 computes the AND between a signal ZBLK and the computation result from the OR gate 100, and supplies the computation result as a signal ACC (Active control) to the LSA core 3a. That is, making signal ZBLK and the computation result from the OR gate 100 high will cause the AND gate 101 to output high signal ACC. Note that signal ZBLK is a signal for selecting the block BLK in which the memory cell transistor MT to be read is provided. This signal is made high when the sense amplifier 3 is to perform precharging and sensing.

The LSA control circuit 83 causes the delay circuit 102 to further delay the delay signal /LSARST supplied from the LSA reset delay circuit 82, and supplies the signal to the inverter 103. The inverter 103 then supplies, to the OR gate 104, signal LSARST obtained by inverting the delay signal /LSARST supplied from the delay circuit 102.

The OR gate 104 computes the OR between signal LSARST from the inverter 103, signal /SEDLY, and signal ZBLK, and outputs the computation result as signal /SE to the LSA core 3a. When one of signal LSARST, signal /SEDLY, and signal ZBLK is made high, signal /SE is made high.

<Arrangement of LSA Core 3a>

Figure 8:
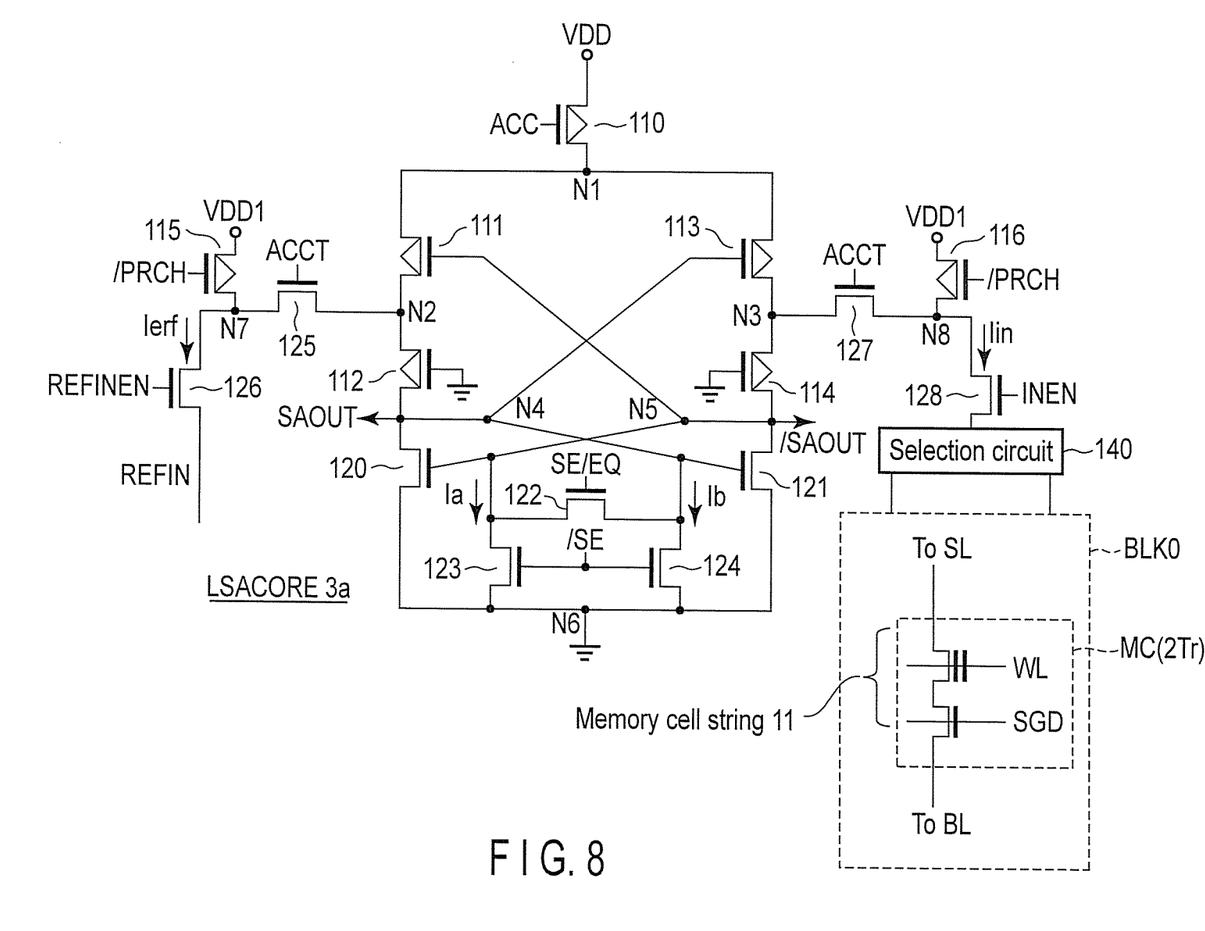
FIG. 8 is a circuit diagram showing the arrangement of the sense amplifier according to the first embodiment.

An example of the arrangement of the LSA core 3a which operates based on signals described with reference to FIGS. 5, 6, and 7 will be described next with reference FIG. 8. As shown in FIG. 8, the LSA core 3a includes p-channel type MOS transistors 110 to 116, n-channel type MOS transistors 120 to 128, and a select circuit 140.

A voltage VDD is applied to one end of the current path of MOS transistor 110, and the other end is connected to a node N1. Signal ACC is supplied to the gate of this transistor. When MOS transistor 110 is turned on by signal ACC, a current flows in nodes N4 and N5 (to be described later) to charge them. In this case, nodes N4 and N5 need to be low.

One end of the current path of MOS transistor 111 is commonly connected to the other terminal of MOS transistor 110 at node N1, and the other end is connected to a node N2. The gate of MOS transistor 111 is connected to node N5. That is, when the potential of node N5 becomes less than or equal to the threshold voltage of MOS transistor 111, MOS transistor 111 is turned on to make node N1 conductive to node N2. That is, MOS transistor 111 can change its current supply ability in accordance with the potential of node N5.

In addition, one end of the current path of MOS transistor 112 is commonly connected to the other terminal of MOS transistor 111 at node N2, and the other end is connected to node N4. The gate of MOS transistor 112 is grounded. That is, MOS transistor 112 is always kept on. Note that the potential of node N4 is set at a voltage SAOUT. Node N4 is connected to one terminal of a logic circuit (EXOR gate) (not shown).

One end of the current path of MOS transistor 113 is commonly connected to the other terminal of MOS transistor 110 at node N1, the other end is connected to a node N3. The gate of MOS transistor 113 is connected to node N4. That is, when the potential of node N4 becomes less than or equal to the threshold voltage of MOS transistor 113, MOS transistor 113 is turned on to electrically connect node N1 to node N3. That is, MOS transistor 113 can change its current supply ability in accordance with the potential of node N4.

In addition, one end of the current path of MOS transistor 114 is commonly connected to the other terminal of MOS transistor 113 at node N3, and the other end is connected to node N5. The gate of MOS transistor 114 is grounded. That is, MOS transistor 114 is always kept on. Note that the potential of node N5 is set at the voltage SAOUT. That is, the potential of node N5 is the value obtained by inverting the potential of node N4. Node N5 is connected to the other terminal of a logic circuit (EXOR gate) (not shown).

In addition, one end of the current path of MOS transistor 120 is connected to node N4, and the other end is grounded via a node N6. The gate of MOS transistor 120 is connected to node N5.

One end of the current path of MOS transistor 122 is connected to node N5, and the other end is connected to node N4. A signal SE/EQ is supplied to the gate of MOS transistor 122. That is, turning on signal SE/EQ will make nodes N4 and N5 have the same potential.

One end of the current path of MOS transistor 123 is commonly connected to one terminal of MOS transistor 122 at node N5, and the other end is grounded via node N6. Signal /SE is supplied to the gate of MOS transistor 123. In addition, one end of the current path of MOS transistor 124 is connected to node N4, and the other end is grounded via node N6. Signal /SE is supplied to the gate of MOS transistor 124. That is, when MOS transistors 123 and 124 are turned on in accordance with the value of signal /SE, nodes N4 and N5 are grounded, and a current corresponding to the current supply ability of MOS transistor 111 flows into node N6 via node N2, MOS transistor 112, node N4, and MOS transistor 124. Likewise, a current corresponding to the current supply ability of MOS transistor 113 flows into node N6 via node N3, MOS transistor 114, node N5, and MOS transistor 123. In this case, let Ib be a current flowing into the N6 via node N4 and MOS transistor 124, and Ia be a current flowing into node N6 via node N5 and MOS transistor 123.

One end of the current path of MOS transistor 125 is connected to node N2, and a signal ACCT is supplied to the gate. The signal ACCT controls gate which transfers data to sense amplifier. More specifically, signal ACCT controls timing when data is transfer to sense amplifier.

In addition, for example, $VDD_1$ (<voltage VDD) is applied to one end of the current path of MOS transistor 115, and the other end is commonly connected to the other terminal of MOS transistor 125 at node N7. A signal /PRCH is supplied to the gate of MOS transistor 115.

One end of the current path of MOS transistor 126 is connected to the other end of each of the current paths of MOS transistor 115 and MOS transistor 125 at node N7. A signal REFINEN is supplied to the gate of MOS transistor 126. That is, when signals /PRCH and REFINEN turn on MOS transistors 115 and 126, the source current generated by MOS transistor 115 flows into the source terminal of MOS transistor 126. Thereafter, when the voltage of the source terminal of MOS transistor 126 is saturated, MOS transistor 125 turned on by signal ACCT makes the source current generated by MOS transistor 115 flow into node N2 via MOS transistor 125. Note that a signal line REFIN is connected to the source terminal of MOS transistor 126.

One end of the current path of MOS transistor 127 is connected to node N3. Signal ACCT is supplied to the gate of MOS transistor 127. The voltage $VDD_1$ (<voltage VDD) is applied to one end of the current path of MOS transistor 116, and the other end is commonly connected to the other end of the current path of MOS transistor 127 at a node N8. Signal /PRCH is supplied to the gate of MOS transistor 116. That is, MOS transistor 128 is turned on in accordance with a signal INEN, and makes a current $I_{in}$ flow in the bit line BL. In addition, MOS transistor 127 is turned on in accordance with signal ACCT, and transfers the source current to node N3.

One end of the current path of MOS transistor 128 is connected to the other end of the current path of MOS transistor 116 at node N8, and a plurality of bit lines BL are connected to the other terminal of MOS transistor 128 via the select circuit 140. The select circuit 140 selects a given one of the plurality of bit lines BL in accordance with, for example, the bit line BL select signal supplied from the control signal generator 8. This charges the selected bit line BL to a predetermined voltage.

Note that the EXOR gate described above (not shown) computes the EXOR between the voltages output from nodes N4 and N5, and supplies the computation result to a detection circuit (not shown). That is, if the LSA core 3a is normally operating, the voltages of nodes N4 and N5 are made either high or low. If, therefore, the LSA core 3a is normally operating, the EXOR gate outputs a high signal as a computation result on node N4 (SAOUT) and N5 (/SAOUT). The detection circuit (not shown) detects the computation result from the EXOR gate to detect whether the LSA core 3a is normally operating.

<Operation of LSA Core 3a>

Figure 9:
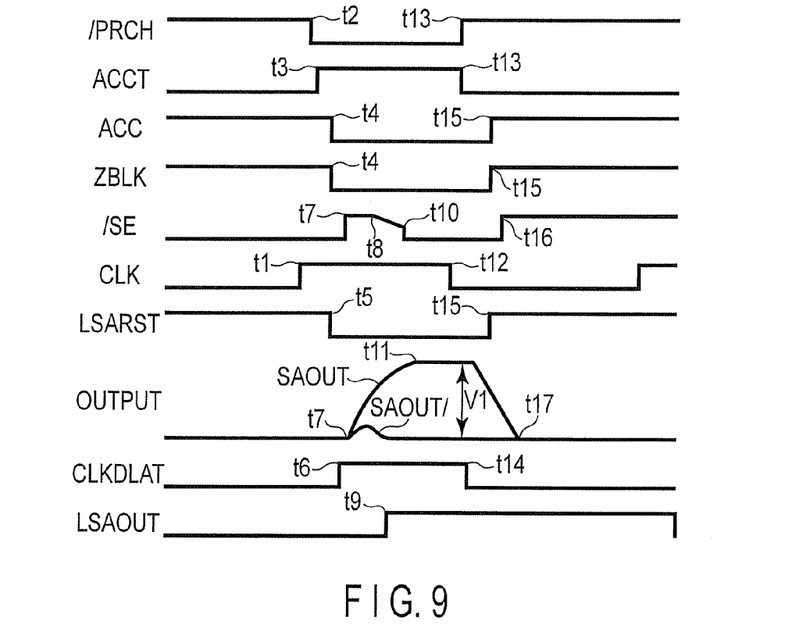
FIG. 9 is a timing chart showing the operation of the flash memory according to the first embodiment.

The operation of the LSA core 3a described above will be described next with reference to FIG. 9. FIG. 9 is a timing chart showing the operation of the LSA core 3a. The ordinate represents signal PREH, signal ACCT, signal ZBLK, signal /SE, clock CLK, signal LSARST, the potentials of nodes N4 and N5, signal CLKDLAT, and the data LSAOUT (data output to the data input/output buffer 6), and the abscissa represents time.

As shown in FIG. 9, first of all, at time t1, clock CLK is made high. This causes the memory cell to start data read operation. Signal SE/EQ shown in FIG. 8 is then temporarily made high to turn on MOS transistor 122 so as to make nodes N4 and N5 have the same potential.

Subsequently, while signal ACC is high, signal /PRCH is made low and signals INEN and REFINEN are made high at time t2. This turns on MOS transistors 115, 116, 126, and 128 to charge the selection bit line BL selected by the select circuit 140 and the reference input line REFIN. At this time, a read voltage VCGR is transferred to the selected word line to which the memory cell transistors MT subjected to data sensing is selected, and a voltage VREAD is transferred to the unselected word line WL to which the remaining memory cell transistors MT are selected. In this case, if the value of the read voltage VCGR is larger than the threshold voltage of the selected memory cell transistor MT, 2Tr is turned on. Assume that a current flowing in the memory cell string 11 is a current $I_{in}$.

When signal ACCT is made high at time t3, MOS transistors 125 and 127 are turned on to make a current flow in node N2 via MOS transistor 125 and make a current flow in node N3 via MOS transistor 127. As a consequence, the potentials of nodes N2 and N3 rise. Note that the potential of node N3 is lower than that of node N2.

Let $I_{ref}$ be a current flowing in the reference signal line REFIN. Assume that in this case, since the memory cell string 11 is ON, the relationship between $I_{in}$ and $I_{ref}$ satisfies $I_{in}>I_{ref}$.

Subsequently, at time t4, signal ACC is made low as signal ZBLK is made low (see FIG. 7). Therefore, node N1 is charged to, for example, the voltage VDD by a source current flowing out from MOS transistor 110. In this case, the voltage of signal ACC is set to, for example, the voltage (VDD+ threshold voltage of MOS transistor 110).

At time t5, signal LSARST is made low. Note that even when signal LSARST is made low, the value of signal ZBLK is made low. For this reason, the output of the AND gate 101 is kept at low even after time t5.

At time t6, signal CLKDLAT is made high. In addition, as described above, at time t5, signal LSARST is made low, and hence signal /SE is made high at time t7 (see FIG. 7).

MOS transistors 123 and 124 are therefore turned on, and nodes N4 and N5 are set to ground potential. In the early stage of sensing operation, since currents flowing in MOS transistor 111 and MOS transistor 113 are equal to each other, $I_a<I_b$ holds from the relationships of $I_{in}>I_{ref}$ and $I_a+I_{in}>I_b+I_{ref}$.

At time t8, as MOS transistors 123 and 124 perform current sensing and the level of signal /SE decreases, SAOUT>/SAOUT. As the potential of the voltage SAOUT approaches the threshold voltage of MOS transistor 121, voltage sensing is performed, and the potential difference between SAOUT and /SAOUT abruptly increases. The sensing operation is then complete. That is, chronologically speaking, since the potential of node N4 is higher than that of node N5 as described above, as the voltage of node N4 rises, the current supply ability of MOS transistor 113 decreases, and the current $I_a$ stops flowing (/SAOUT in FIG. 9). In contrast to this, since no current flows in MOS transistor 113, the potential of node N5 decreases, and the current supply ability of MOS transistor 111 for the current $I_b$ increases. At time t11, therefore, the potential of node N4 is amplified to V1 (SAOUT in FIG. 9). Thereafter, the potential of node N4 rises, and MOS transistor 113 is turned off.

At time t12, clock CLK is made low. At time t13, signal /PRCH is made high, and signal ACCT is made low to finish precharging the selected bit line BL, node N3, the reference signal line REFIN, and node N2. Subsequently, at time t14, signal CLKDLAT is made low. That is, the data controller 3b stores the voltage SAOUT from node N4 as read data. As a consequence, the data controller 3b stores binary 0 read out from the memory cell transistor MT.

At time t15, making signals LSARST and ZBLK high will make signal ACC high. This makes MOS transistor 110 stop charging node N1.

Subsequently, at time t16, signal /SE is made high (see FIG. 7). That is, MOS transistors 123 and 124 are turned on, and the potentials of nodes N4 and N5 are set to ground potential. At time t17, the potentials SAOUT and /SAOUT of nodes N4 and N5 are set to 0 V.

After time t9, the data LSAOUT read out from the memory cell transistor MT is transferred from the data controller 3b to an external host device (not shown) via the data input/output buffer 6 and the input/output control circuit 5.

The state in which the memory cell string 11 in the LSA core 3a is turned on has been described above. Obviously, however, this embodiment may be applied to the inverse state. That is, when the memory cell string 11 is turned off, the magnitude relationship in potential between nodes N4 and N5 is inverted. In other words, voltage SAOUT<voltage /SAOUT. As a result, the data controller 3b stores binary 1 from the memory cell transistor MT to be read.

<Effects of Embodiment>

The semiconductor storage device according to this embodiment can improve operational reliability. That is, as described with reference to the above operation, the voltages SAOUT and /SAOUT of nodes N4 and N5 of the sense core 3a are detected, and the data controller 3b is made to latch the detection results. Thereafter, the potentials of nodes N4 and N5 are set to ground potential. That is, no voltage will be applied to MOS transistors 111 and 113. This reduces the loads on MOS transistors 111 and 113, and hence can prevent a deterioration in the characteristics of MOS transistors 111 and 113 due to NBTI (negative bias instability).

In contrast to this, assume that even after data read out from the data controller 3b is latched, the potentials of nodes N4 and N5 are not grounded and are kept at predetermined voltages until the start of the next precharge operation. That is, as this NBTI period prolongs, the loads on MOS transistors 111 and 113 increase. This may lead to a deterioration in transistor characteristics. A deterioration in transistor characteristics will lead to a failure to accurately read out data, i.e., a deterioration in reliability.

In contrast to this, as described above, the sense core 3a according to this embodiment can shorten the NBTI period and prevent instable operation.

Second Embodiment

Figure 10:
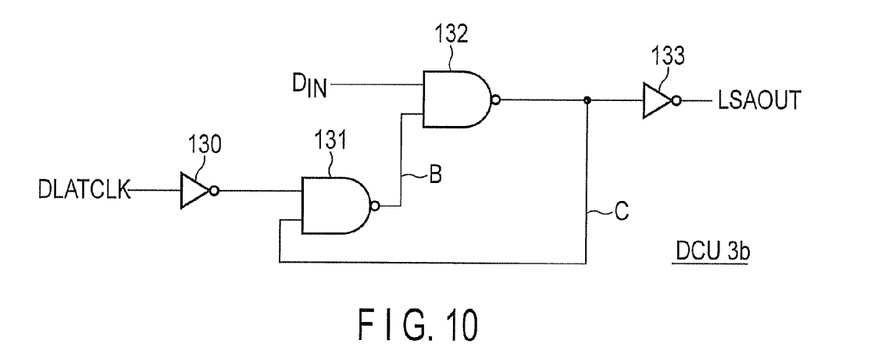
FIG. 10 is a circuit diagram showing the arrangement of a data controller according to the second embodiment.

A semiconductor storage device according to the second embodiment will be described next with reference to FIGS. 10, 11, 12, 13, and 14. FIG. 10 is a circuit diagram showing the details of a data controller 3b in FIG. 2, and more specifically, a circuit diagram showing the arrangement of the data latch circuit of the data controller 3b.

As shown in FIG. 10, the data controller 3b includes inverters 130 and 133 and NAND gates 131 and 132. In this case, a signal Din input to one terminal of the NAND gate 132 is data LSAOUT supplied from an LSA core 3a. Note that the data controller 3b performs reset operation, data transfer operation, and latch operation in the order named based on a signal CLKDLAT. Upon performing this data transfer operation, the data controller 3b shifts from a reset state high or low) to a latch state high or low). That is, the reset state indicates a state in which data is held, and the data held by the data controller 3b is determined by the holding potential of a wire B or C.

Figure 11:
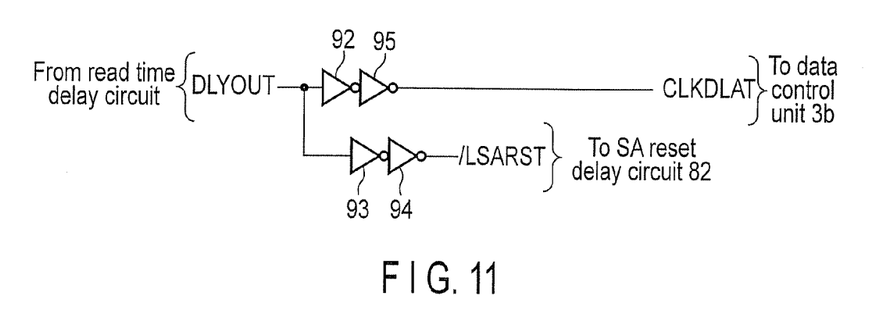
FIG. 11 is a circuit diagram showing the internal arrangement of a control signal generator according to the second embodiment.

An example of the arrangement of a timing logic setting circuit 81-2 according to this embodiment will be described next with reference to FIG. 11. As shown in FIG. 11, the timing logic setting circuit 81-2 has an arrangement obtained by omitting the AND gates 90 and 91 from the arrangement in the first embodiment and newly adding an inverter 95. An inverter 92 supplies the signal obtained by inverting a signal DLYOUT, i.e., a signal /DLYOUT, to the inverter 95. The inverter 95 then inverts signal /DLYOUT supplied from the inverter 92, and supplies the resultant signal as signal CLKDLAT to the data controller 3b.

Inverters 93 and 94 are the same as those in the first embodiment, and hence a description of them will be omitted. According to the above description, the timing logic setting circuit 81-2 may be configured not to use signals CLKPAD and ASPAD described in the first embodiment.

Figure 12:
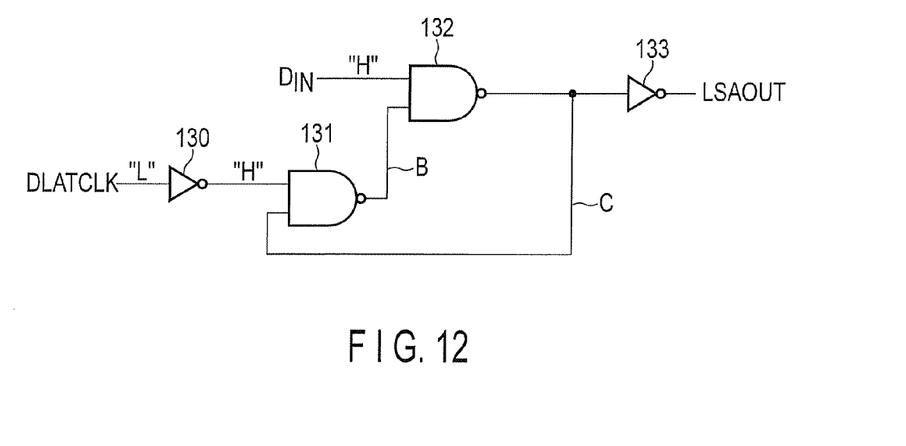
FIG. 12 is a conceptual view showing the reset operation of the data controller according to the second embodiment.
Figure 13:
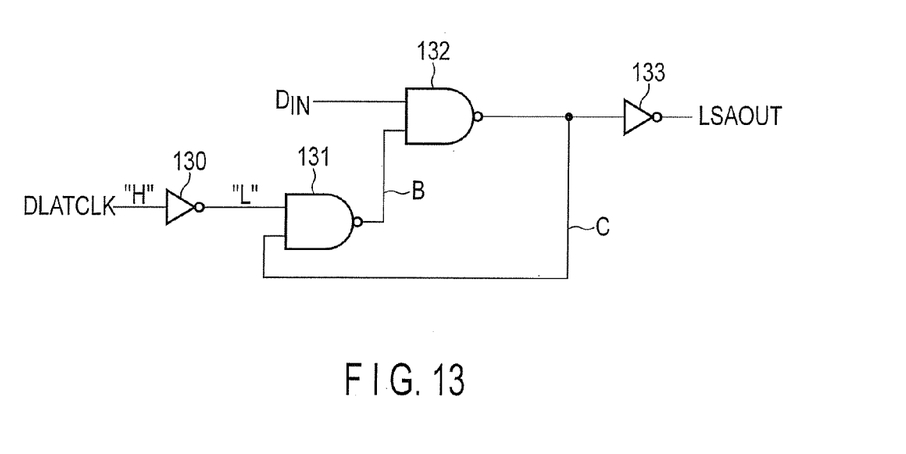
FIG. 13 is a conceptual view showing the transfer operation of the data controller according to the second embodiment.
Figure 14:
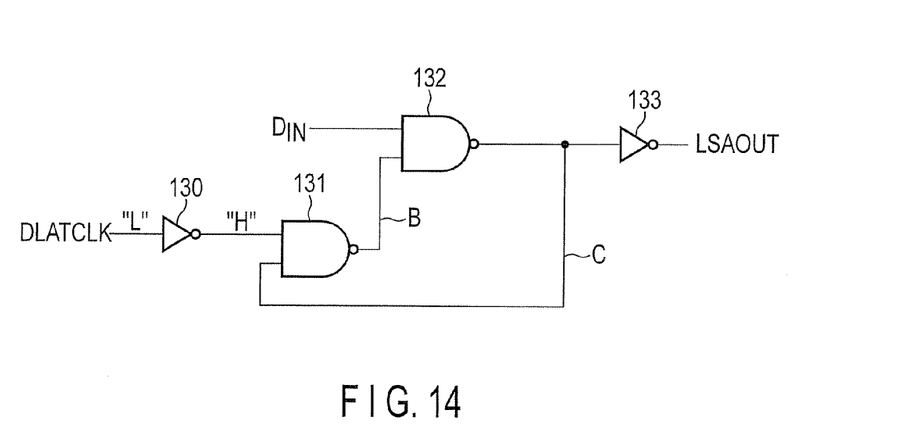
FIG. 14 is a conceptual view showing the latch operation of the data controller according to the second embodiment.

Operation up to latching data in the data controller 3b will be described next with reference to FIGS. 12, 13, and 14.

<Reset Operation>

Reset operation will be described with reference to FIG. 12. In a reset state, signal CLKDLAT is made low. The inverter 130 therefore transfers the high signal obtained by inverting signal CLKDLAT to the NAND gate 131. In addition, since a signal Din is made high, the potentials of the wires B and C are determined by each other.

That is, if the potential of the wire B is, for example, high, the wire C is made low as a result of NAND operation between the wire B and signal Din to the NAND gate 132. In contrast, if the potential of the wire B is, for example, low, the wire C is made high as a result of NAND operation between the wire B and signal Din to the NAND gate 132. In other words, the potential of the wire B is determined by the potential of the wire C.

<Data Transfer Operation>

Data transfer operation will be described next with reference to FIG. 13. This data transfer operation will update data stored by the data controller 3b. That is, the following description is about the operation of reading out new data from the data stored so far and transferring the read data to the data controller 3b.

At the time of data transfer, signal CLKDLAT is made high. The inverter 130 therefore transfers the low signal obtained by inverting signal CLKDLAT to the NAND gate 131. The NAND gate 131 computes the NAND between the signal supplied from the inverter 130 and the potential of the wire C. In this case, since the signal supplied from the inverter 130 is made low, the computation result obtained by the NAND gate 131 is made high regardless of the value of a signal C.

The value of signal Din is set to the value of the data latched by the data controller 3b. That is, if the value of signal Din is high, the NAND gate 132 makes the potential of the wire C low as a result of NAND operation between signal Din and the potential of the wire B. In contrast to this, if the value of signal Din is low, the NAND gate 132 make the potential of the wire C high as a result of NAND operation between signal Din and the potential of the wire B.

<Latch Operation>

Latch operation will be further described below with reference to FIG. 14. As shown in FIG. 13, when latch operation starts, signal CLKDLAT shifts goes low. The inverter 130 then transfers the value obtained by inverting signal CLKD- LAT to the NAND gate 131. The NAND gate 131 computes the NAND between the inverted signal CLK and the value of the wire C.

That is, when the wire C is low, the wire B is made high. In contrast to this, when the wire C is made high, the wire B is made low. In this case, even if the value of signal Din is high, i.e., the above reset operation is performed, the values of the wires B and C do not change. That is, the data is latched and the value of the wire C is inverted by the inverter 133. This value is then transferred as the data LSAOUT to the data input/output buffer 6.

<Effects of Second Embodiment>

The semiconductor storage device according to this embodiment can also obtain the same effects as those of the first embodiment. In addition, the second embodiment uses a flip-flop or the like as the DCU in FIG. 2.

The second embodiment uses the DCU in FIG. 10. This DCU determines the wires C as H level and the data LSAOUT as L level when Din is temporarily made low at the time of latch operation. That is, the data determination time is determined by the read time of data from the LSA reset delay circuit 82 (the read time is set by the delay circuit in FIG. 5). This obviates the necessity of the LSA reset delay circuit 82 in FIG. 4.

Note that the first and second embodiments have exemplified the memory cell MC (2Tr) formed from the memory cell transistor MT and the select transistor ST series-connected to the memory cell transistor MT. However, the embodiments are not limited to this. For example, the embodiments can also be applied to a 3Tr-NAND type flash memory including one memory cell transistor in a NAND or NOR type flash memory. In addition, the embodiments can be applied to a NAND type flash memory and can be widely applied to general nonvolatile semiconductor memories having a stacked gate structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of memory cells formed for each column and each row, each being connected to a bit line at one end of a current path; and
a sense amplifier reading out data held by the memory cell by comparing a first current flowing in the bit line in accordance with the data with a second current flowing in a reference signal line which is set as a comparison current for the first current,
wherein the sense amplifier includes:
a first MOS transistor having one end of a current path to which a first voltage is applied, the other end connected to a first node, and a gate to which a first signal is supplied;
a second MOS transistor having one end of a current path connected to the first node, and the other end connected to a second node to which the reference signal line is connected, the second MOS transistor having one of a first supply ability and a second supply ability higher than the first supply ability in accordance with the data held by the memory cell;
a third MOS transistor having one end of a current path connected to the first node, and the other end connected to a third node connected to the bit line, the third MOS transistor having one of a third supply ability and a fourth supply ability higher than the third supply ability in accordance with a current flowing in the reference signal line; and
a switch unit configured to ground each of the second MOS transistor and the third MOS transistor when a second signal is supplied,
wherein the first signal and the second signal are sequentially generated based on a same set of signals, the second signal being associated with the first signal, and
the sense amplifier turns off the first MOS transistor after transferring the data read out from the memory cell to an outside, and then supplies the second signal to the switch unit to set gates of the second MOS transistor and third MOS transistor to ground potential.

2. The device according to claim 1, further comprising a timing generator configured to generate a third signal for making a data latch store the data, the first signal, the second signal, and a fourth signal delayed relative to the third signal, based on a clock signal for controlling a timing of transferring the data read out from the memory cell to the outside.

3. The device according to claim 2, further comprising a controller generating the first signal and the second signal based on the fourth signal,
wherein the controller includes a delay circuit delaying the second signal relative to the first signal.

4. The device according to claim 1, wherein when the second MOS transistor has the second supply ability in accordance with the data, the third MOS transistor has the third supply ability lower than the second supply ability.

5. The device according to claim 1, further comprising a data latch storing the data transferred from the sense amplifier,
wherein the data latch receives the data via the third signal at a timing when the data is transferred, and stores the received data by inverting the third signal,
with a holding period of the data stored in the data latch corresponding to the period in which the third signal is inverted.

6. The device according to claim 1, further comprising a data latch storing the data transferred from the sense amplifier,
wherein the data is stored in the data latch based on a fourth signal generated based on a clock signal for controlling a timing when the data read out from the memory cell is transferred to an outside, and
when the fourth signal is activated, the second signal generated based on the fourth signal activates the switch unit.

7. The device according to claim 1, further comprising a data latch storing the data transferred from the sense amplifier,
wherein a set of the plurality of memory cells forms a block as a unit of erasure of the data, and
the first MOS transistor is turned off by the first signal generated by a fourth signal generated based on a clock signal for controlling a timing when the data read out from the memory cell is transferred to an outside and a fifth signal for unselecting the block formed by the memory cells from which the data have been read out, when the data latch stores the data.

8. The device according to claim 4, wherein the first current is larger than the second current.

9. The device according to claim 1, wherein the memory cell includes a select transistor connected to the bit line at one end of a current path and connected to the sense amplifier via the bit line and a cell transistor series-connected to the select transistor.

10. The device according to claim 1, further comprising:
- an EXOR operation circuit performing computation between outputs from the second node and the third node, and
- a detector detecting a computation result obtained by the EXOR operation circuit,
- wherein the detector detects a read error of the data in accordance with the computation result.

11. The device according to claim 2, further comprising a data latch configured to store the data transferred from the sense amplifier,
- wherein after the data latch latches the data based on the third signal, the switch circuit is turned on by the second signal generated based on the fourth signal.

* * * * *